(12) United States Patent
Hu

(10) Patent No.: US 7,745,729 B2
(45) Date of Patent: Jun. 29, 2010

(54) CONDUCTIVE CONNECTION AND CUTTING METHOD THEREOF

(75) Inventor: Shuo-hsiu Hu, Hsin-Chu (TW)

(73) Assignee: AU Optronics Corp., Hsin-Chu (TW)

( * ) Notice: Subject to any disclaimer, the term of this patent is extended or adjusted under 35 U.S.C. 154(b) by 821 days.

(21) Appl. No.: 11/668,728

(22) Filed: Jan. 30, 2007

(65) Prior Publication Data

US 2008/0007685 A1 Jan. 10, 2008

(30) Foreign Application Priority Data

Jul. 6, 2006 (TW) .................................. 95124708

(51) Int. Cl.
*H01B 7/08* (2006.01)
(52) U.S. Cl. .................................. 174/117 F
(58) Field of Classification Search ........................ None
See application file for complete search history.

(56) References Cited

U.S. PATENT DOCUMENTS 6,542,374 B1 4/2003 Muramatsu et al.

7,399,928 B2* 7/2008 Sakamoto ................. 174/117 F
7,633,012 B2* 12/2009 Yeh ......................... 174/110 R

FOREIGN PATENT DOCUMENTS

| TW | I240099 | 9/2005 |
|---|---|---|
| TW | 200612794 | 4/2006 |

* cited by examiner

*Primary Examiner*—Timothy Rude

(57) ABSTRACT

A conductive connection such as a flexible printed circuit board (FPC) or flexible flat cable is disclosed. The conductive connection has a substrate and conductive wires provided on the substrate. After the conductive connection is cut to be put into application, ends of the wires extend out of an edge of the substrate due to the cutting. In accordance with the present invention, the substrate edge from which the wire ends extend out has protrusions provided. Accordingly, when the conductive connection is applied to a flat display of a mobile phone, for example, short circuit resulting from the wire ends extending out of the substrate edge improperly contacting metal portion of other phone parts is avoided.

17 Claims, 7 Drawing Sheets

CONDUCTIVE CONNECTION AND CUTTING METHOD THEREOF

TECHNICAL FIELD OF THE INVENTION

The present invention relates to a conductive connection, more particularly, to cutting method for conductive connection such as flexible printed circuit board (FPC) and flat cable and the like.

BACKGROUND OF THE INVENTION

Thin Film Transistor Liquid Crystal Displays (TFT LCDs) and other types of flat displays have been widely utilized in various devices such as portable devices (e.g. mobile phone, digital camera, PDA, etc.) For example, there are currently multifarious mobile phone products of various types available. The requirements fore display panels are of small amount but diversification. In addition, the flat display panels of the same specific resolution and size are usually used in different mobile phone designs. Accordingly, connections between the panel and the mobile phone system are various. It will be great cost and expense for a panel manufacturer if different production and testing equipments must be disposed for various connections. Furthermore, a risk of mistake in production will be increased. Therefore, a scheme that the same production and testing equipments can be commonly applied to connections of different sizes and specifications is developed.

To be adaptable to the same production and testing equipments, a flexible printed circuit board (FPC) is designed as shown in FIG. 1. In this drawing, reference number 10 indicates a flexible substrate, 11 indicates wires, which are made of copper foil, for example, 12 indicates a custom-required section, 13 indicates a testing end, and 14 indicates a custom-designated connector. FPCs are manufactured based on such a design, and tested at the testing ends 13 by the same testing equipment. After testing is accomplished, the FPC is then cut according to the customer's requirement for the connection size. FIG. 2 shows an example of a cut FPC.

However, there is a problem resulted from such a scheme. FIG. 3 shows a side view of a cut FPC. As shown, the wire and substrate of the FPC fail to be flush with each other in cutting since the materials thereof are different. As a result, a terminal of the cut wire 11 extends out of an edge of the substrate 10. In other words, the cut FPC is subjected to a condition of wire-exposure. When such an FPC is applied to a mobile phone, for example, the wire-end which extends out of the edge of the substrate may contact a metal portion of another component in the mobile phone, resulting in improper short-circuit.

SUMMARY OF THE INVENTION

An objective of the present invention is to provide a conductive connection. When such a conductive connection is put to use, a wire-end extending out of an edge of a substrate due to cutting will not improperly contact other components. Therefore, short circuit can be avoided.

Another objective of the present invention is to provide a conductive connecting cutting method. For a conductive connection cut by using the method, a wire-end extending out of an edge of a substrate due to cutting will not improperly contact other components. Therefore, short circuit can be avoided.

In accordance with an aspect of the present invention, the conductive connection includes a substrate and a plurality of wires. The wires are disposed on the substrate, and terminals of the wires extend out of an edge of the substrate due to cutting. The edge of the substrate has at least one protrusion. The protrusion length exceeds the extending length of the wire-end out of the edge. The protrusion is provided at a position of the substrate edge without any wire passing. The shape of the protrusion can be varied.

In accordance with another aspect of the present invention, the conductive connection cutting method includes cutting a conductive connection, wherein a terminal of a wire of the conductive connection extends out of an edge of a substrate due to the cutting. In the method, at least one protrusion is left at the substrate edge. The protrusion length exceeds the extending length of the wire-end out of the edge. The protrusion is provided at a position of the substrate edge without any wire passing. The shape of the protrusion can be varied.

DETAILED DESCRIPTION OF THE INVENTION

The technical features of the present invention will be described in detail with reference to the drawings.

Figure 1:
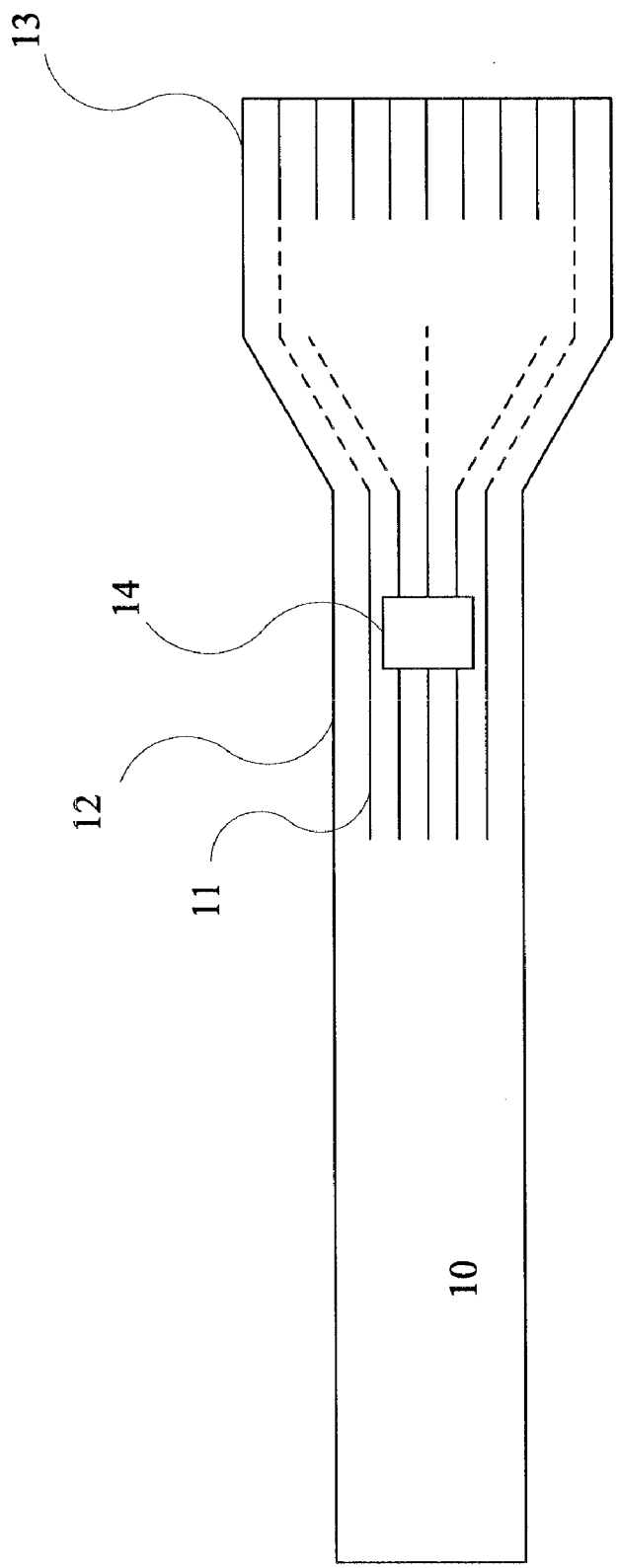
FIG. 1 is a schematic illustration showing a prior art FPC of unified specifications.
Figure 2:
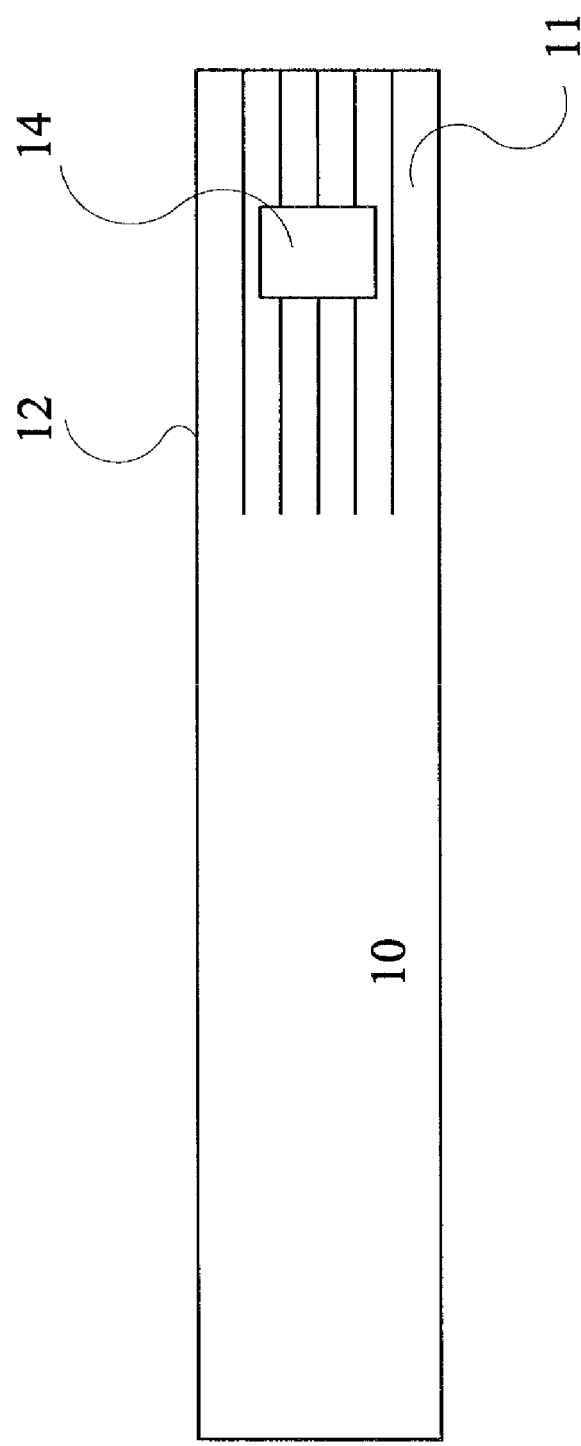
FIG. 2 is a schematic illustration showing the structure of the FCP of FIG. 1 after being cut.
Figure 3:
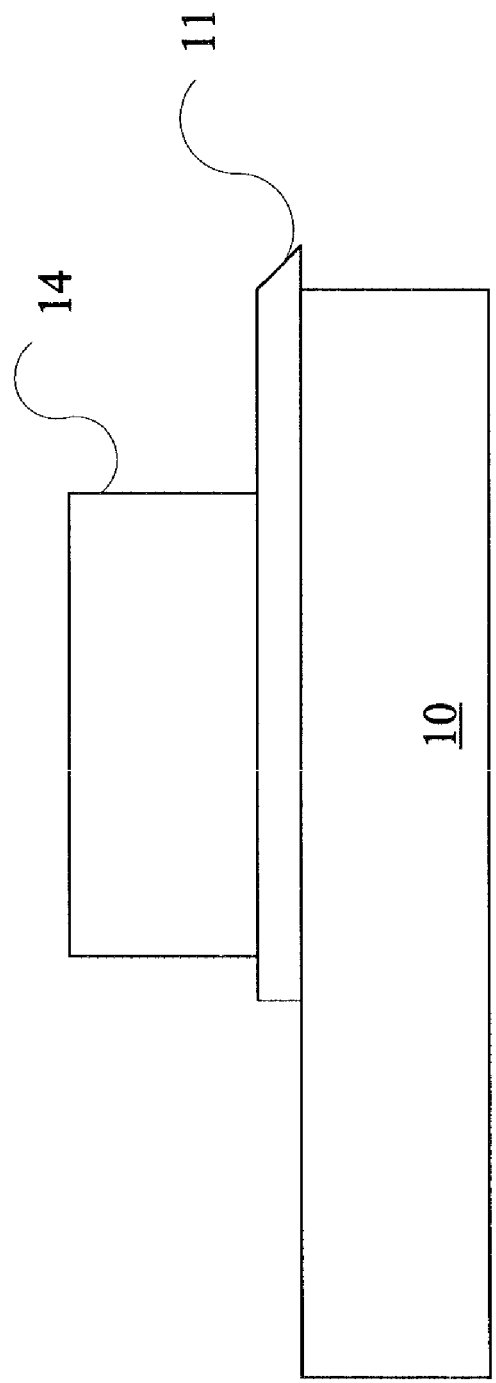
FIG. 3 is an enlarged side view showing a portion of the cut FPC in FIG. 2.
Figure 4:
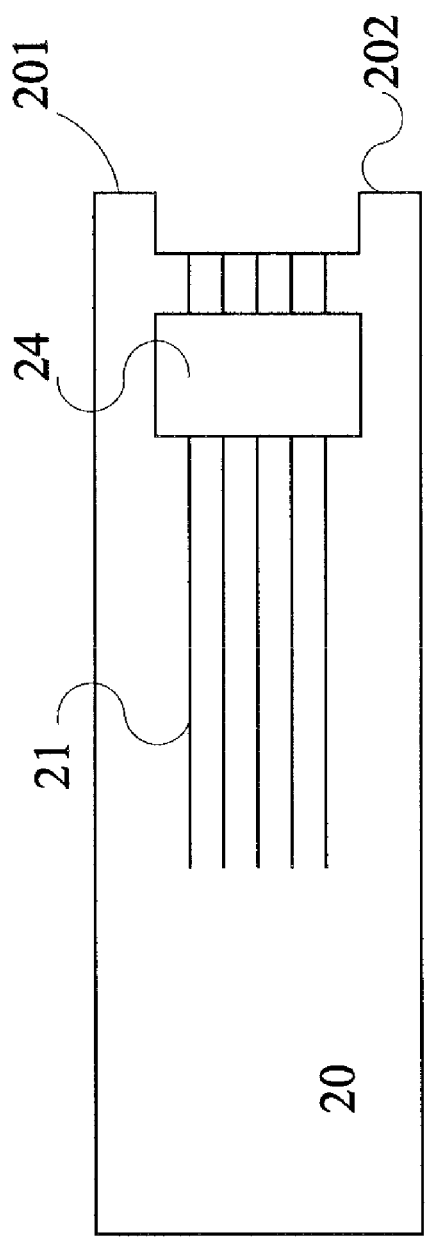
FIG. 4 shows an FPC which is cut in accordance with a first embodiment of the present invention.

According to the present invention, after a conductive connection (e.g. an FPC) is cut, protrusions are left at an edge of a substrate of the connection, wherein wire-ends extend out of the edge. FIG. 4 shows a conductive connection cut in accordance with the method of the present invention. In the present embodiment, the conductive connection is a flexible printed circuit board (FPC) electrically connected to a display panel (not shown). As shown, there is a plurality of wires 21 extending on a flexible substrate 20. Reference number 24 indicates a custom-designated connector. The wires extend out of an edge of the substrate 20. As shown, the edge has two protrusions 201, 202 respectively disposed at the uppermost and lowermost positions of the edge. No wires extend to these positions.

Figure 5:
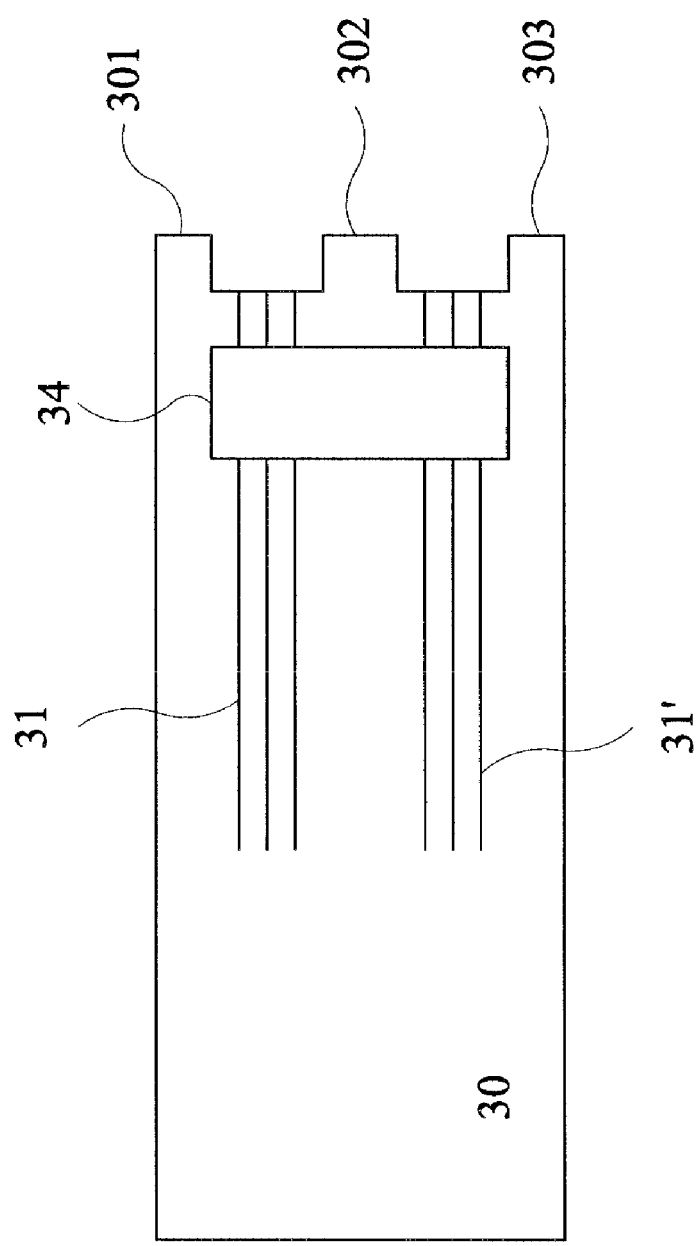
FIG. 5 shows an FPC which is cut in accordance with a second embodiment of the present invention.

FIG. 5 shows an FPC in accordance with another embodiment of the present invention. As shown, a flexible substrate 30 has two groups of wires 31, 31' provided thereon. Reference number 34 indicates a custom-designated connector. The two groups of wires 31, 31' extend out of an edge of the substrate 30. Three protrusions 301, 302, 303 are left at the edge. It is noted that there is no special limit for the positions where the protrusions are disposed, except that each protrusion should be disposed at a position of the edge where no wire extends. In addition, there is no special limit for the size of the protrusion, except that the length of the protrusion should exceed the length of the wire-end extending out of the substrate edge. The length of the wire-end is usually very small.

Figure 6:
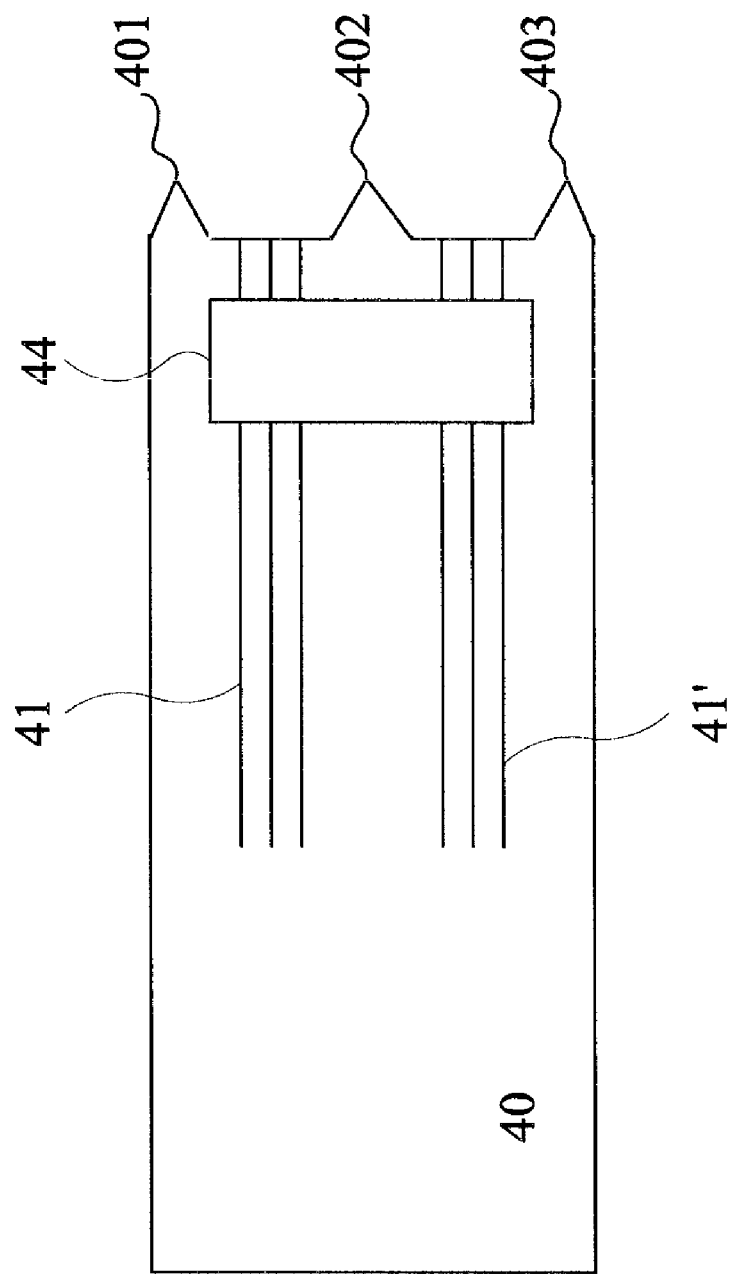
FIG. 6 shows an FPC which is cut in accordance with a third embodiment of the present invention.
Figure 7:
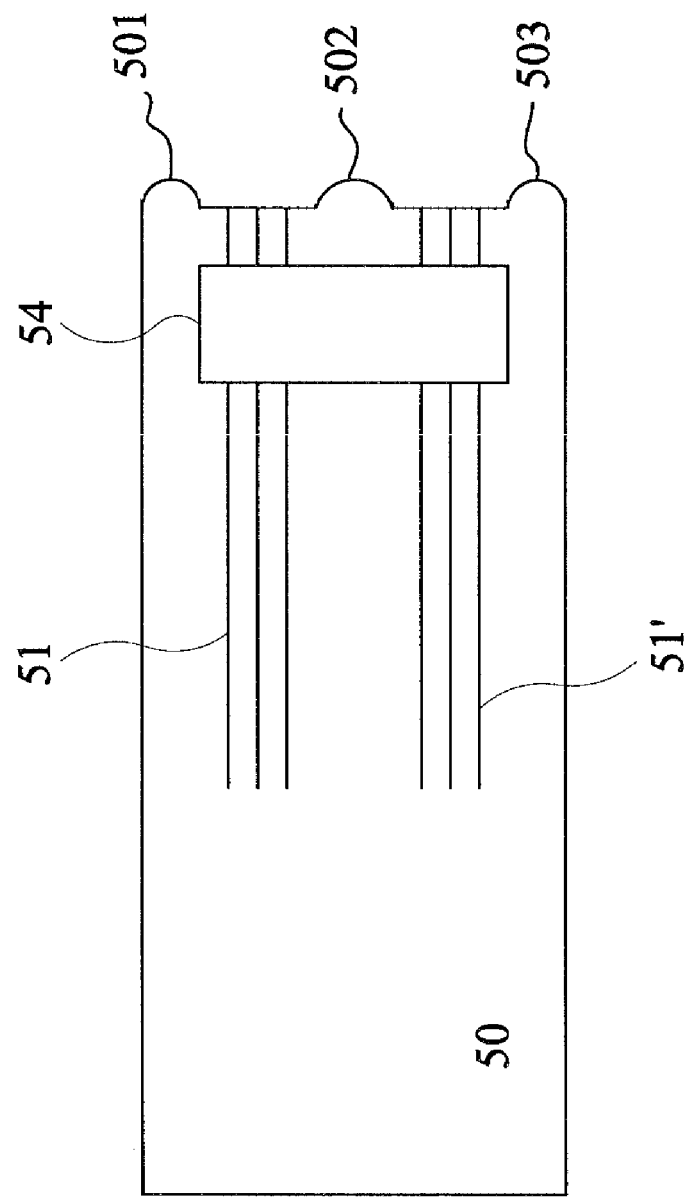
FIG. 7 shows an FPC which is cut in accordance with a fourth embodiment of the present invention.

In the above two embodiments, the protrusions at the substrate edge are all rectangular. However, there is no limit for the shape of the protrusion. FIG. 6 shows an FPC in accordance with a further embodiment of the present invention, wherein reference numbers the same as those in FIG. 5 respectively indicate the same elements, and therefore the descriptions thereof are omitted herein. The only difference is that protrusions 401, 402, 403 in the present embodiment are triangular rather than rectangular. FIG. 7 shows an FPC in accordance with a further embodiment of the present invention, wherein reference numbers the same as those in FIG. 5 respectively indicate the same elements. Thus, the descriptions thereof are omitted herein. In the present embodiment, each of protrusions 501, 502, 503 appears to be an arc (e.g. semi-circle) shape.

If some wires are bended and extend out of another edge of the substrate, then this edge should also has at least one protrusion in accordance with the present invention. If there is any wire-end extends out of any one of the edges of the substrate, then the edge should have the protrusion. Preferably, there are protrusions provided at both sides by the position where the wire-ends extending out of the substrate. When the FPC cut according to the present invention is applied in a mobile phone, for example, the wire-ends extending out of the substrate edge can be protected from improperly contacting with metal portion of another component, so that short circuit can be avoided.

In each of the above embodiments, FPC is described as an example. However, the present invention can also be applied to other conductive connections such as flat cable and the like are also.

While the preferred embodiments of the present invention have been illustrated and described in detail, various modifications and alterations can be made by persons skilled in this art. The embodiment of the present invention is therefore described in an illustrative but not restrictive sense. It is intended that the present invention should not be limited to the particular forms as illustrated, and that all modifications and alterations which maintain the spirit and realm of the present invention are within the scope as defined in the appended claims.

What is claimed is:

1. A conductive connection comprising:
   a substrate having at least one protrusion at an edge; and
   a plurality of wires disposed on the substrate, wire-ends of the wires extending out of the edge of the substrate, wherein a length of the protrusion exceeds a length of the wire-ends extending out of the edge.

2. The conductive connection of claim 1, wherein the substrate has a plurality of protrusions at the edge.

3. The conductive connection of claim 1, wherein each protrusion is disposed at a position of the edge where no wire extends.

4. The conductive connection of claim 1, wherein a shape of the protrusion comprises rectangular.

5. The conductive connection of claim 1, wherein a shape of the protrusion comprises triangular.

6. The conductive connection of claim 1, wherein the protrusion appears as an arc shape.

7. The conductive connection of claim 1, wherein the conductive connection comprises a flexible printed circuit board.

8. The conductive connection of claim 1, wherein the conductive connection comprises a flat cable.

9. A flat display device comprising:
   a display panel; and
   a conductive connection electrically connected to the display panel, comprising:
      a substrate having at least one protrusion at an edge; and
      a plurality of wires disposed on the substrate, wire-ends of the wires extending out of the edge of the substrate, wherein a length of the protrusion exceeds a length of the wire-ends extending out of the edge.

10. A cutting method for a conductive connection, the conductive connection having a substrate and a plurality of wires disposed on the substrate, the method comprising:
   cutting the conductive connection to form at least one protrusion at an edge of the substrate and wire-ends of the wires extending out of the edge of the substrate, wherein a length of the protrusion exceeds a length of the wire-ends extending out of the edge.

11. The method of claim 10, wherein a plurality of protrusions are formed at the edge.

12. The method of claim 10, wherein each protrusion is formed at a position of the edge where no wire extends.

13. The method of claim 10, wherein a shape of the protrusion comprises rectangular.

14. The method of claim 10, wherein a shape of the protrusion comprises triangular.

15. The method of claim 10, wherein the protrusion appears as an arc shape.

16. The method of claim 10, wherein the conductive connection comprises a flexible printed circuit board.

17. The method of claim 10, wherein the conductive connection comprises a flat cable.

* * * * *